United States Patent
Nojima

(10) Patent No.: US 11,632,099 B2
(45) Date of Patent: Apr. 18, 2023

(54) DRIVER AND SENSOR CIRCUITRY FOR POWER SEMICONDUCTOR SWITCHES USING OPTICAL POWER SUPPLIES

(71) Applicant: Eaton Intelligent Power Limited, Dublin (IE)

(72) Inventor: Geraldo Nojima, Fort Mill, SC (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 17/337,670

(22) Filed: Jun. 3, 2021

(65) Prior Publication Data

US 2022/0393669 A1 Dec. 8, 2022

(51) Int. Cl.
*H03K 17/042* (2006.01)
*H03K 3/012* (2006.01)

(52) U.S. Cl.
CPC ....... *H03K 3/012* (2013.01); *H03K 17/04206* (2013.01)

(58) Field of Classification Search
CPC .......................... H03K 3/012; H03K 17/04206
See application file for complete search history.

(56) References Cited

U.S. PATENT DOCUMENTS

| | | | |
|---|---|---|---|
| 10,985,745 | B1 | 4/2021 | Nojima et al. |
| 2013/0009491 | A1* | 1/2013 | Hafner ................. H03K 17/785 307/113 |
| 2014/0168840 | A1* | 6/2014 | Hafner .................. H03K 17/18 361/86 |
| 2020/0355880 | A1* | 11/2020 | Wright ..................... G02B 6/43 |
| 2022/0109363 | A1* | 4/2022 | Lin .......................... H02M 1/08 |

FOREIGN PATENT DOCUMENTS

WO 2015068194 A1 5/2015

OTHER PUBLICATIONS

Broadcom; AFBR-POCxxxL Data Sheet; Optical Power Converter; (2017-2019); 11 pages.
The International Search Report and Written Opinion for International Application No. PCT/EP2022/025250 with international filing date May 27, 2022, and dated Nov. 3, 2022.

* cited by examiner

*Primary Examiner* — Sibin Chen
(74) *Attorney, Agent, or Firm* — Stanek Lemon Crouse & Meeks, P.A.

(57) ABSTRACT

A system includes a sensor circuit configured to sense a parameter of a power system having an operating voltage greater than a voltage rating of the sensor circuit, an optical communications circuit configured to receive a sensor signal from the sensor circuit and to generate an optical communications signal therefrom, and an optical power supply circuit configured to receive an optical input, to generate electrical power from the received optical input and to supply the generated electrical power to the sensor circuit and the optical communications circuit. A driver circuit may be configured to generate a first control signal applied to a control terminal of the power semiconductor switch, and the optical power supply circuit may be configured to supply the generated electrical power to the sensor circuit, the optical communications circuit and the driver circuit.

18 Claims, 5 Drawing Sheets

DRIVER AND SENSOR CIRCUITRY FOR POWER SEMICONDUCTOR SWITCHES USING OPTICAL POWER SUPPLIES

BACKGROUND

The inventive subject matter relates to electrical power apparatus and methods and, more particularly, to apparatus for driving and monitoring power semiconductor switches.

Semiconductor switches, such as insulated gate bipolar transistors (IGBTs) and power metal-oxide-semiconductor field-effect transistors (MOSFETs), are used in a variety of different types of electrical power applications, such as in rectifiers, inverters, motor drives and the like. Solid state circuit breakers incorporating such semiconductor switches have also been developed, with the semiconductor switches being used to replace the electromechanical switches traditionally used in such devices. In such applications, semiconductor switches offer advantages of speed and resistance to environmental degradation. Such devices, such as IGBTs and power MOSFETs, are commonly driven by gate driver circuits that provide the gate voltage levels needed to drive these devices. These gate driver circuits are typically powered by conventional lower-voltage power supplies.

Increasingly, wide bandgap semiconductor power devices, such as silicon carbide (SiC) devices, are being used in power converters and other applications. These devices offer advantages of lower conduction losses, higher voltage ratings and higher switching speeds. However, interfacing of such devices to control circuitry can be problematic because of the relatively high voltage levels (e.g., greater than 10 kV) and switching speeds (e.g., greater than 5 kHz) at which they may be operated.

SUMMARY

Some embodiments provide a system including a driver circuit configured to receive a first control signal and to responsively apply a second control signal to a control terminal of a power semiconductor switch (e.g., a wide bandgap FET). An optical communications circuit is configured to receive an optical communications signal and to responsively generate the first control signal. An optical power supply circuit is configured to receive an optical input, to generate electrical power from the received optical input and to supply the generated electrical power to the driver circuit and the optical communications circuit. The driver circuit may include a push-pull circuit configured to drive the power semiconductor switch and the system may further include a voltage regulator circuit configured to receive electrical power from the optical power supply circuit, to generate a regulated voltage therefrom and to apply the regulated voltage to a power supply input of the push-pull circuit.

The optical communications signal may include a first optical communications signal and the system may further include a sensor circuit configured to sense at least one operating parameter associated with the power semiconductor switch and to responsively generate a sensor signal. The optical communications circuit may be configured to receive the sensor signal and to generate a second optical communications signal therefrom.

The system may further include a driver control circuit configured to control the voltage regulator circuit responsive to the second optical communications signal. The driver circuit may include a variable output resistor that couples the push-pull circuit to the control terminal of the power semiconductor switch. The driver control circuit may be further configured to control the variable output resistor responsive to the second optical communications signal.

Further embodiments provide a system including a sensor circuit configured to sense a parameter of a power system having an operating voltage greater than a voltage rating of the sensor circuit. An optical communications circuit is configured to receive a sensor signal from the sensor circuit and to generate an optical communications signal therefrom. An optical power supply circuit is configured to receive an optical input, to generate electrical power from the received optical input and to supply the generated electrical power to the sensor circuit and the optical communications circuit. The system may further include a driver circuit configured to generate a first control signal applied to a control terminal of the power semiconductor switch/The optical power supply circuit may be configured to supply the generated electrical power to the sensor circuit, the optical communications circuit and the driver circuit. The optical communications circuit may be configured to provide a second control signal to the driver circuit and the driver circuit may generate the first control signal responsive to the second control signal.

The system may further include a driver control circuit configured to control the driver circuit responsive to the optical communications signal generated by the optical communications circuit from the sensor signal. The optical power supply may be configured to provide electrical power to the driver control circuit. The driver circuit may include a push-pull circuit configured to drive the power semiconductor switch and the driver control circuit may include a voltage regulator circuit configured to receive electrical power from the optical power supply circuit, to generate a regulated voltage therefrom and to apply the regulated voltage to a power supply input of the push-pull circuit. The driver control circuit may be configured to control the regulated voltage produced by the regulator circuit responsive to the optical communications signal generated by the optical communications circuit from the sensor signal. The driver circuit may further include a variable output resistor that couples the push-pull circuit to the control terminal of the power semiconductor switch and the driver control circuit may be further configured to control the variable output resistor responsive to the optical communications signal generated by the optical communications circuit from the sensor signal.

DETAILED DESCRIPTION

Figure 1:
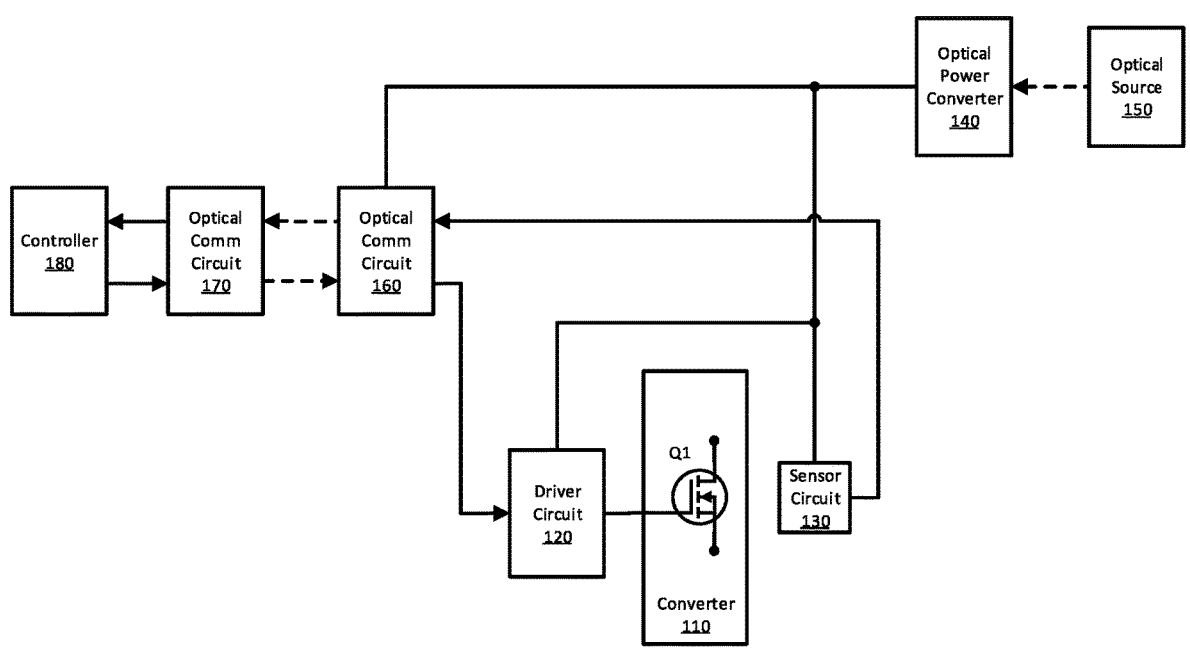
FIG. 1 is a schematic diagram of a power supply arrangement for a circuit that controls a power MOSFET switch according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Some embodiments of the inventive subject matter arise from a realization that conventional gate drivers, sensor circuits and other circuits for controlling and/or monitoring power semiconductor switching devices, such as power MOSFETs, may be inadequate for use with wide bandgap power semiconductors devices, such as SiC transistors. Conventional gate driver circuits typically are powered using transformer-based power supplies, and primary and secondary windings of these power supply transformers may act as plates of a capacitor that can vary between 4 pF and 10 pF. As wide bandgap power devices may generate voltage transients of more than 100 kV/μs, a 10 pF capacitor may pass a displacement current on the order of 1 A. Such a displacement current could disrupt operation of control circuitry, such as the control circuitry of the converter in which the wide bandgap power device is used, leading to potentially catastrophic failures. Moreover, the isolation voltage of such transformer-based circuits may be limited, and thus the control circuitry could be exposed to damaging voltage levels. Some embodiments of the inventive subject matter can avoid such problems by using gate drivers and other circuitry that are powered by an optical (e.g., laser-based) power supply that converts light energy from an optical source (e.g., a laser) into electrical energy that is supplied the gate driver and other circuitry. Such arrangements can enable nuisance-free switching operation in the presence of large voltage and current transients and the electric and magnetic fields associated therewith.

FIG. 1 illustrates a system according to some embodiments of the inventive subject matter. The system includes a power semiconductor switch, here illustrated as a power MOSFET Q1 included in a power converter circuit 110, such as an inverter in a motor drive. A driver circuit 120 is configured to drive a gate terminal of the MOSFET Q1 responsive to switch state control signal provided by a first optical communications circuit 160. The switch state control signal may represent a desired state of the MOSFET Q1 (e.g., "on" or "off") and may be generated responsive to an optical signal transmitted to the first optical communications circuit 160 by a second optical communications circuit 170 over an optical communications medium, such as an optical fiber. The second optical communications circuit 170 may generate the optical communications signal responsive to a control signal generated by a controller 180, which may be a controller for the converter 110. The first and second optical communications circuits 160, 170 may perform various signal processing operations (e.g., electrical to optical conversion, parallel to serial conversion, etc.) to convey corresponding information to the driver circuit 120 to place the power MOSFET Q1 into a desired state.

As further illustrated, the system may also include a sensor circuit 130 that is configured to sense a parameter associated with the converter circuit 110. The sensed parameter may include, for example, a voltage, current, temperature or other parameter associated with operation of the converter circuit 110. High performance converters often require control feedback signals (current and voltage) that are generated by high bandwidth sensors that can respond from DC to 1 MHz. With next generation power semiconductor technologies, such as the 10 kV silicon carbide MOSFETs, converters may be operated at higher voltages and frequencies with voltage transients that are nearly forty times higher than that experienced by silicon IGBTs used in conventional medium voltage (MV) converters. These new devices can generate voltage rates of change (dV/dt) on the order of 220 kV per microsecond dV/dt and current rates of change (di/dt) on the order of 35 kA per microsecond while handling DC link voltages up to 25 kV. Conventional sensors typically cannot handle both the dielectric strength and EMI immunity required.

Some embodiments of the inventive subject matter address such problems by using high-performance sensors rated for use in conventional MV converters (which typically operate at voltages up to 7.2 kV) in applications having a substantially greater operating voltage by galvanically isolating the sensors from grounded systems using optical power supplies and optical communications interfaces such that the sensors are isolated from the ground potential like a "bird on a wire." Examples of high-performance sensors that may be used in such a way include the LF1010-S current transducer and the DV 6400 voltage transducer distributed by LEM International SA. Such sensors may be optically isolated as described herein so that they have little or no coupling capacitance to grounded or powered systems, which reduces or eliminates any displacement currents associated with the high dV/dt described above. In this way, sensors can be used that have otherwise desirable characteristics (e.g., high EMI immunity) but voltage ratings substantially below that of the higher voltage system that it they are monitoring. In the illustrated embodiments, for example, a sensor signal provided by the sensor circuit 130 may be provided to the first optical converter circuit 160, which may convey corresponding information to the controller 180 via a fiber optic channel coupled to the second optical communications circuit 170. The controller 180 (e.g., a microcontroller-based control circuit) may use this information to, for example, generate the control signal used to control the power MOSFET Q1 of the converter circuit 110.

In the illustrated embodiments, each of the first optical communications circuit 160, the sensor circuit 130 and the driver circuit 120 are powered by an optical power converter circuit 140. The optical power converter circuit 140 is configured to receive an optical signal generated by an optical source 150 (e.g., a laser) via an optical channel (e.g., an optical fiber), and to convert the received light power into electrical power to supply the first optical communications circuit 160, the sensor circuit 130 and the driver circuit 120. Examples of such optical power converters are the AFBR-POSxxxL line of optical power converters distributed by Broadcom Inc. and described at https://docs.broadcom.com/doc/AFBR-POCxxxL-DS Arrangements along the line illustrated in FIG. 1 may be used provide isolation of the power MOSFET Q1 and the other circuitry directly connected thereto from the controller 180 (e.g., a microcontroller-based circuit) and other control circuitry. This may be particularly advantageous in high-voltage applications, such as applications in which the MOSFET is a silicon carbide (SiC) device that is operated at relatively high voltages and switching speeds that can generate significant voltage and current transients that may disrupt operation of the control circuitry.

Figure 2:
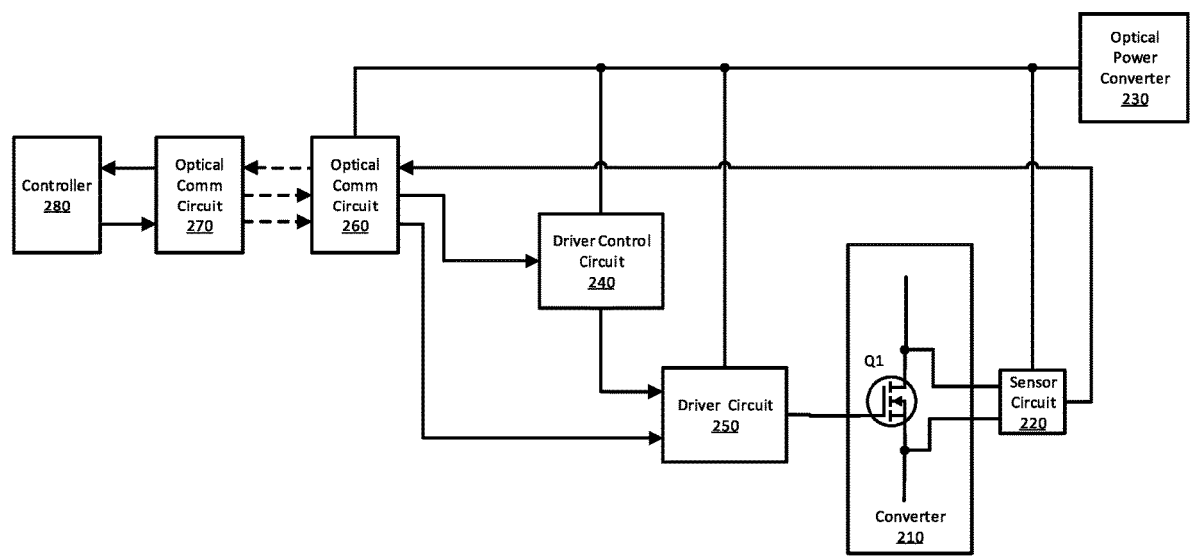
FIG. 2 is a schematic diagram of a power supply arrangement for a driver circuit for a power MOSFET switch according to some embodiments.

Additional embodiments may use similar optical power arrangements. For example, FIG. 2 illustrates a system in which a power MOSFET Q1 (e.g., an SiC MOSFET) of a converter 210 is driven by a driver circuit 250 that receives a switch state control signal (i.e., a signal that commands an "on" or "off" state of the MOSFET Q1) from a first optical communications circuit 260, and responsively controls the power MOSFET Q1. The switch state control signal may, for example, correspond to a control signal applied by a controller 280 to a second optical communications circuit 270, which responsively generates a corresponding optical communications signal that is conveyed to the first optical communications circuit 260 via, for example, an optical fiber channel.

The driver circuit 250 is also controlled by a driver control circuit 240, which is configured to control parameters of the driver circuit 250 that effect the manner in which the driver circuit 250 responds to the switch state command signal applied to the driver circuit 250. For example, a sensor circuit 220 may be configured to sense operational parameters of the power MOSFET Q1 of the converter 210, and to feed this sensed information to the controller 280 via the first optical communications circuit 260 and the second optical communications circuit 270. The sensed information may include, for example, information that indicates the "on" state voltage of the MOSFET Q1 and/or the switching state timing of the MOSFET Q1, as explained in greater detail below. Responsive to this sensed information, the controller 280 may command the driver control circuit 240 (e.g., via the optical channel between the first and second optical communications circuits 260, 270) to control characteristics of the driver circuit 250 to provide a desired response to the switch state control signal applied to the driver circuit 250, and thus control, for example, the behavior (e.g., on time, on-state resistance, etc.) of the MOSFET Q1. Applications involving using sensor feedback to control operations of a power semiconductor driver circuit are described, for example, in U.S. patent application Ser. No. 16/785,050, entitled "DRIVERS FOR POWER SEMICONDUCTOR SWITCHES USING DEVICE FEEDBACK", filed Feb. 7, 2020, and incorporated herein by reference in its entirety. As further shown, according to some embodiments, the sensor circuit 220, the driver circuit 250, the driver control circuit 240 and the first optical communications circuit 260 may be powered by an optical power converter circuit 230 to provide isolation of these circuits from the controller 280 and other circuitry.

Figure 3:
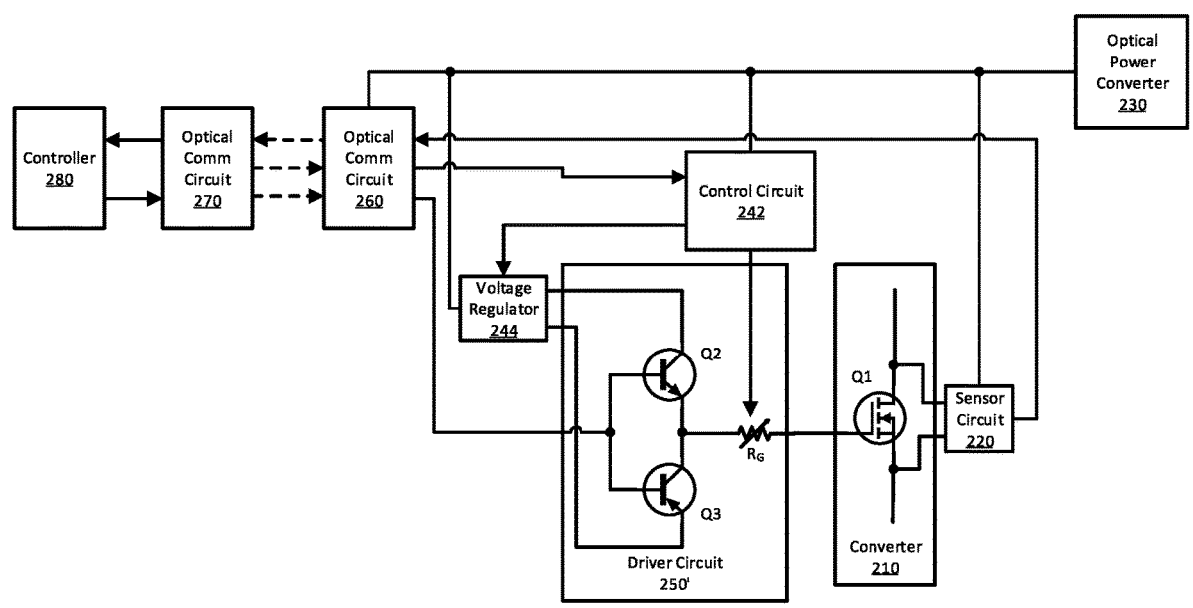
FIG. 3 is a schematic diagram of a power supply arrangement for a circuit that controls a power MOSFET switch according to some embodiments.

FIG. 3 illustrates an example of using such an arrangement with a driver circuit 250' comprising a push-pull circuit including first and second gate driver transistors Q2, Q3 that are connected in a totem-pole arrangement and which drive a gate terminal of the MOSFET Q1 via a variable gate drive output resistor $R_G$. A control circuit 242 receives a control signal from the controller 280 via the first and second optical communications circuits 260, 270, and responsively controls a voltage regulator circuit 244 that applies a power supply voltage to the push-pull circuit including the first and second gate driver transistors Q2, Q3. This enables control of the voltage range applied to the gate terminal of the MOSFET Q1, thus enabling control of its on-state resistance. The control circuit 242 can also similarly control the level of the gate drive output resistor $R_G$ to vary the speed at which the MOSFET Q1 transitions in response to a change in the switch state control signal applied to the driver circuit 250'.

Figure 4:
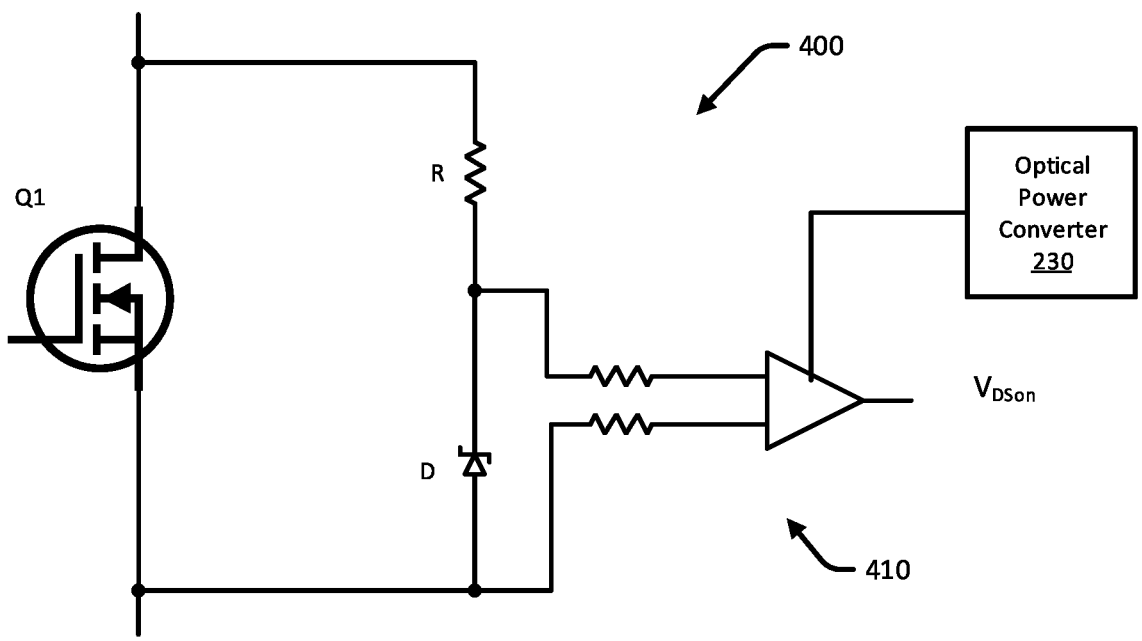
FIGS. 4 and 5 are schematic diagrams of sensor circuits of the circuit of FIG. 3.

FIG. 4 illustrates a sensor circuit 400 that may be used to detect an on-state voltage of the MOSFET Q1 of FIG. 3, which can, in turn, be used to control on-state resistance of the MOSFET Q1. The sensor circuit 400 includes a zener diode D connected in series with a resistor R between source and drain terminals of the transistor Q1. An amplifier circuit 410 amplifies a voltage across the zener diode D to generate a sensor signal $V_{DS}$, which can indicate an on-state voltage of the transistor Q1. The amplifier circuit 410 is powered by an optical power converter 230, along the lines discussed above with reference to FIGS. 2 and 3.

When the transistor Q1 is off, there may be a voltage (e.g., a power supply voltage for a converter including the transistor Q1) substantially greater than the reverse breakdown voltage of the zener diode D across the transistor Q1. This results in the voltage across the zener diode D being clamped at the reverse breakdown voltage of the zener diode D, thus preventing damage to the amplifier circuit 410. When the transistor Q1 is on, however, the on-state voltage across the transistor Q1 is less than the reverse breakdown voltage of the zener diode D, causing the on-state voltage to be applied to the input of the amplifier circuit 410. Thus, when the transistor Q1 is on, the sensor signal $V_{DS}$ represents the on-state voltage of the transistor Q1.

The voltage signal $V_{DS}$ in this state can be used to adjust the power supply voltage applied to the totem-pole circuit of the gate driver circuit 250' that is driving the transistor Q1. In particular if the on-state voltage sensor signal $V_{DS}$ indicates a greater than desired on-state voltage (and, thus, a greater than desired on-state resistance), the power supply voltage applied to the totem-pole circuit of the gate driver circuit 250' can be increased to increase the voltage applied to the gate terminal of the MOSFET Q1, driving it further into saturation and reducing the on-state voltage. Conversely, if the on-state voltage sensor signal $V_{DS}$ indicates a less than desired on-state voltage (and, thus, a less than desired on-state resistance), the power supply voltage applied to totem-pole circuit of the gate driver circuit 250' can be reduced to reduce the voltage applied to the gate terminal of the MOSFET Q1 and thereby increase the on-state voltage.

Figure 5:
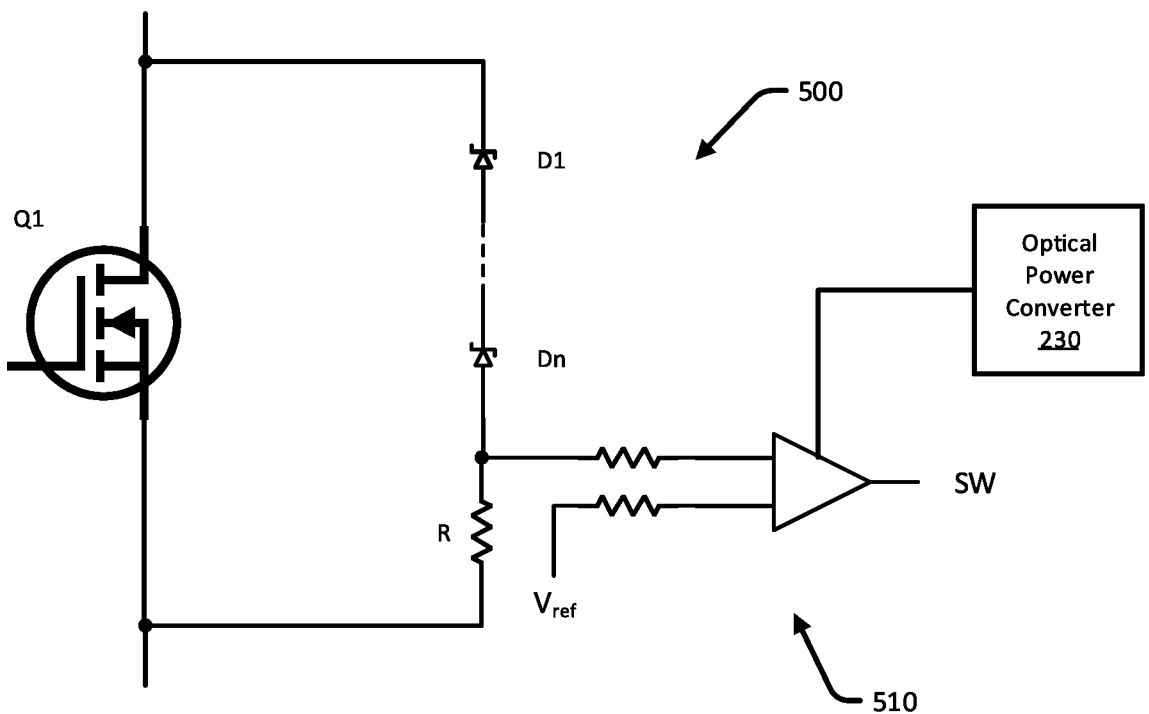

FIG. 5 illustrates a sensor circuit 500 that may be used to detect on/off transition times of the MOSFET Q1 of FIG. 3, which can be used to control the output resistor $R_G$ of the gate driver circuit 250'. The sensor circuit 500 includes a plurality of diodes D1, . . . , Dn connected in series with a resistor R between source and drain terminals of the transistor Q1. A comparator circuit 510 powered by the optical power converter 230 compares a voltage across the resistor R to a reference voltage $V_{ref}$. When the MOSFET Q1 is off, the voltage across the resistor R is greater than the reference voltage $V_{ref}$, causing a sensor signal SW output by the comparator circuit 410 to have first state (e.g., a "1"). When the MOSFET is on, the voltage across the resistor R is less than the reference voltage, causing the sensor signal SW to have a second state (e.g., a "0"). This circuit can be used to determine the transition time of the MOSFET Q1. This information can be used to adjust the output resistor $R_G$ of the gate driver circuit 250'.

Figure 6:
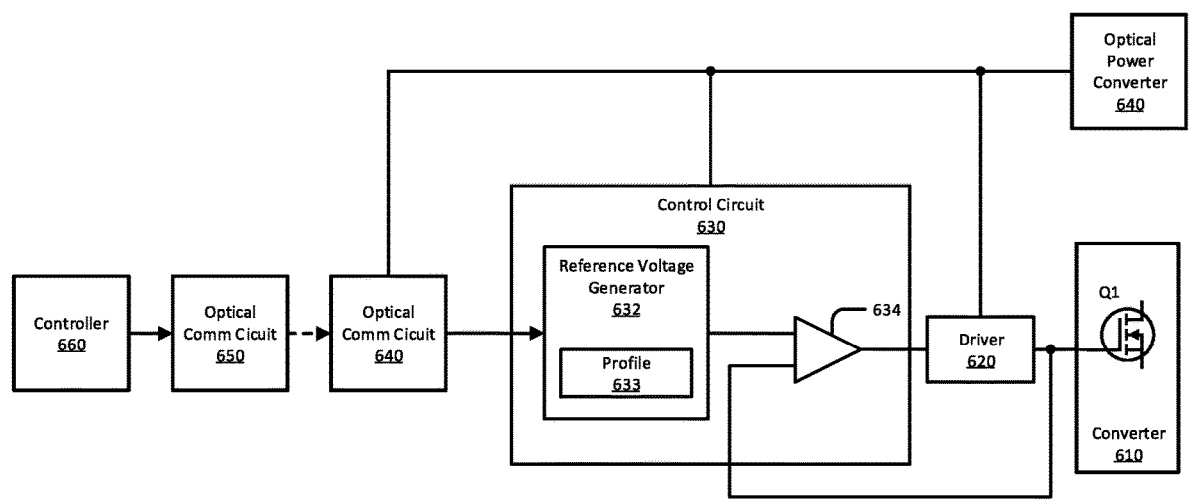
FIG. 6 is a schematic diagram illustrating a power supply arrangement for a closed loop driver for a power MOSFET switch according to some embodiments.

FIG. 6 illustrates circuitry for controlling a MOSFET Q1 of a converter 610 according to further embodiments. A driver circuit 620 is configured to drive a gate terminal of the MOSFET Q1 responsive to a switch state control signal generated a control circuit 630. The switch state control signal corresponds to a command to place the MOSFET into an "on" or "off" state. The control circuit 630 includes a comparison circuit 634 (e.g., a hysteresis current regulator), which receives a reference voltage signal from a voltage reference generator circuit 632 and compares the reference voltage signal to a feedback signal corresponding to a voltage at a gate terminal of the MOSFET Q1 and regulates to the desired output on a continuous basis utilizing current regulation. The reference voltage signal is generated to drive a desired switch state transition for the MOSFET Q1, e.g., a transition from "on" to "off" or vice versa. As shown, the reference voltage may conform to a reference voltage profile 633 that corresponds to a desired dynamic behavior of the voltage applied to the gate terminal of the MOSFET Q1. The profile 633 may be implemented using, for example, an analog or digital function generator circuit which provides a desired dynamic response to the reference voltage signal applied to the comparison circuit 634 such that the gate voltage of the MOSFET Q1 exhibits a corresponding behavior in response to a state transition of a switch state control signal applied to the control circuit 630 by a first optical communications circuit 640. The profile 633 may be adjustable responsive to a control input, such as a calibration input. This allows for tuning of the operation of the driver circuit 620 to compensate for the particular characteristics of the MOSFET Q1 being driven. The first optical communications circuit 640 may generate the control signal applied to the control circuit 630 responsive to an optical communications signal generated by a second optical communications circuit 650 in response to a corresponding control signal from a controller 660.

The driver circuit 620, the control circuit 630 and the first optical communications circuit 640 may receive power from an optical power converter 640. In this manner, the drive-related circuitry may be isolated from the controller 660 and other circuitry. It will be appreciated that the profile 633 may be adaptively controlled using sensor circuitry that is similarly isolated using optical communications links and powered by the optical power converter 640. For example, sensor information from the MOSFET Q1 and/or other portions of the converter 610 may be fed back through the first and second optical communications circuits 640, 650 to the controller 660, which may responsively transmit configuration information (via a similar optical path) to the reference voltage generator 632 to cause modification of the profile 633.

The drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. A system comprising:
   a driver circuit configured to receive a first control signal and to responsively apply a second control signal to a control terminal of a power semiconductor switch via a variable output resistor;
   a sensor circuit configured to sense at least one operating parameter associated with the power semiconductor switch and to responsively generate a sensor signal;
   an optical communications circuit configured to receive a first optical communications signal and to responsively generate the first control signal and to receive the sensor signal and to generate a second optical communications signal therefrom;
   a driver control circuit configured to control the variable output resistor responsive to the second optical communications signal; and
   an optical power supply circuit configured to receive an optical input, to generate electrical power from the received optical input and to supply the generated electrical power to the driver circuit and the optical communications circuit.

2. The system of claim 1, wherein the driver circuit comprises a push-pull circuit configured to drive the power semiconductor switch and wherein the system further comprises a voltage regulator circuit configured to receive electrical power from the optical power supply circuit, to generate a regulated voltage therefrom and to apply the regulated voltage to a power supply input of the push-pull circuit.

3. The system of claim 2, wherein the driver control circuit is configured to control the voltage regulator circuit responsive to the second optical communications signal.

4. The system of claim 3, wherein the variable output resistor couples the push-pull circuit to the control terminal of the power semiconductor switch.

5. The system of claim 2, further comprising the power semiconductor switch.

6. The system of claim 5, wherein the power semiconductor switch is included in a power converter circuit.

7. The system of claim 5, wherein the power semiconductor switch comprises a field effect transistor (FET), and wherein the control terminal comprises a gate of the FET.

8. The system of claim 7, wherein the FET comprises a wide bandgap FET.

9. A system comprising:
   a sensor circuit having an input configured to be connected to first and second terminals of a power semiconductor switch and to sense an operating parameter of the power semiconductor switch, at least one of the first and second terminals of the power semiconductor switch having an operating voltage greater than a voltage rating of the sensor circuit;
   an optical communications circuit configured to receive a sensor signal from the sensor circuit and to generate an optical communications signal therefrom; and
   an optical power supply circuit configured to receive an optical input, to generate electrical power from the received optical input and to supply the generated electrical power to the sensor circuit and the optical communications circuit.

10. The system of claim 9, further comprising a driver circuit configured to generate a first control signal applied to a control terminal of a power semiconductor switch, and wherein the optical power supply circuit is configured to supply the generated electrical power to the sensor circuit, the optical communications circuit and the driver circuit.

11. The system of claim 10, wherein the optical communications circuit is configured to provide a second control signal to the driver circuit, and wherein the driver circuit generates the first control signal responsive to the second control signal.

12. The system of claim 10, further comprising a driver control circuit configured to control the driver circuit responsive to the optical communications signal generated by the optical communications circuit from the sensor signal, and wherein the optical power supply is configured to provide electrical power to the driver control circuit.

13. The system of claim 12:
   wherein the driver circuit comprises a push-pull circuit configured to drive the power semiconductor switch; and
   wherein the driver control circuit comprises a voltage regulator circuit configured to receive electrical power from the optical power supply circuit, to generate a regulated voltage therefrom and to apply the regulated voltage to a power supply input of the push-pull circuit.

14. The system of claim 13, wherein the driver control circuit is configured to control the regulated voltage produced by the regulator circuit responsive to the optical communications signal generated by the optical communications circuit from the sensor signal.

15. The system of claim 13, wherein the driver circuit further comprises a variable output resistor that couples the push-pull circuit to the control terminal of the power semiconductor switch and wherein the driver control circuit is further configured to control the variable output resistor responsive to the optical communications signal generated by the optical communications circuit from the sensor signal.

16. The system of claim 10, further comprising the power semiconductor switch.

17. The system of claim 16, wherein the power semiconductor switch is included in a power converter circuit.

18. The system of claim 16, wherein the power semiconductor switch comprises a wide bandgap field effect transistor (FET).

\* \* \* \* \*